(12) United States Patent
Cho

(10) Patent No.: US 11,862,542 B2
(45) Date of Patent: Jan. 2, 2024

(54) DUAL SIDE COOLING POWER MODULE AND MANUFACTURING METHOD OF THE SAME

(71) Applicant: HYUNDAI MOBIS Co., Ltd., Seoul (KR)

(72) Inventor: Hansin Cho, Hwaseong-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/547,949

(22) Filed: Dec. 10, 2021

(65) Prior Publication Data
US 2022/0102249 A1 Mar. 31, 2022

Related U.S. Application Data

(62) Division of application No. 16/697,601, filed on Nov. 27, 2019, now Pat. No. 11,251,112.

(30) Foreign Application Priority Data

Dec. 5, 2018 (KR) .......................... 10-2018-0155073

(51) Int. Cl.
*H01L 23/49* (2006.01)
*H01L 23/495* (2006.01)
(Continued)

(52) U.S. Cl.
CPC ...... *H01L 23/49568* (2013.01); *H01L 21/563* (2013.01); *H01L 23/49861* (2013.01);
(Continued)

(58) Field of Classification Search
CPC ............. H01L 23/49568; H01L 21/563; H01L 23/49861; H01L 2021/60195;
(Continued)

(56) References Cited

U.S. PATENT DOCUMENTS 8,354,684 B2 * 1/2013 West ..................... H01L 33/644
362/800
8,680,656 B1 * 3/2014 Kuo ..................... H01L 31/0547
257/E33.056

(Continued)

FOREIGN PATENT DOCUMENTS

CN 102324407 A 1/2012
CN 102456634 A 5/2012
(Continued)

OTHER PUBLICATIONS

German Office Action dated Feb. 8, 2021 from the corresponding German Aoolication No. 102019132837.3, 8 pp.
(Continued)

*Primary Examiner* — Mohammed Shamsuzzaman
(74) *Attorney, Agent, or Firm* — MORGAN, LEWIS & BOCKIUS LLP

(57) ABSTRACT

A dual side cooling power module includes: a lower substrate including a recessed portion on at least one surface thereof, a semiconductor chip formed in the recessed portion, lead frames formed at both ends of the lower substrate, and an upper substrate formed on the semiconductor chip, a portion of the lead frames, and the lower substrate.

7 Claims, 6 Drawing Sheets

Figure 1:
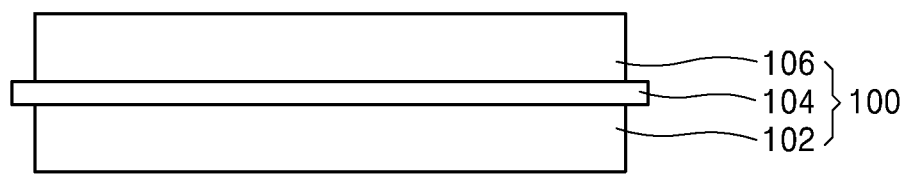

(51) Int. Cl.
*H01L 23/498* (2006.01)
*H01L 21/56* (2006.01)
*H01L 21/60* (2006.01)

(52) U.S. Cl.
CPC ............ *H01L 2021/60195* (2013.01); *H01L 2021/60277* (2013.01)

(58) Field of Classification Search
CPC .......... H01L 2021/60277; H01L 24/33; H01L 24/73; H01L 24/83; H01L 24/92; H01L 24/13; H01L 24/14; H01L 24/16; H01L 24/29; H01L 24/30; H01L 24/32; H01L 24/81; H01L 2224/13082; H01L 2224/13139; H01L 2224/13147; H01L 2224/1329; H01L 2224/13294; H01L 2224/133; H01L 2224/13339; H01L 2224/1403; H01L 2224/16227; H01L 2224/29082; H01L 2224/29139; H01L 2224/29147; H01L 2224/2929; H01L 2224/29294; H01L 2224/293; H01L 2224/29339; H01L 2224/3003; H01L 2224/32227; H01L 2224/3303; H01L 2224/33181; H01L 2224/73253; H01L 2224/73265; H01L 2224/8384; H01L 2224/83855; H01L 2224/92; H01L 2224/92225; H01L 2924/15153; H01L 2924/181; H01L 23/3121; H01L 23/4334; H01L 23/49531; H01L 23/49833; H01L 23/49844; H01L 23/3735; H01L 23/13; H01L 21/4803; H01L 21/52; H01L 23/367; H01L 23/3736; H01L 23/31; H01L 23/495
See application file for complete search history.

(56) References Cited

U.S. PATENT DOCUMENTS

| | | | | |
|---|---|---|---|---|
| 9,437,513 | B2* | 9/2016 | Fuergut | H01L 23/3157 |
| 2002/0020907 | A1* | 2/2002 | Seo | H01L 23/4951 257/778 |
| 2004/0212051 | A1* | 10/2004 | Zhao | H01L 23/49833 257/E23.092 |
| 2005/0151229 | A1* | 7/2005 | Imaizumi | H01L 23/49531 257/676 |
| 2005/0194685 | A1* | 9/2005 | Weiblen | G01L 19/141 257/738 |
| 2006/0284301 | A1* | 12/2006 | Corisis | H01L 24/83 257/690 |
| 2006/0289892 | A1* | 12/2006 | Lee | H01L 33/0093 257/103 |
| 2007/0252166 | A1* | 11/2007 | Chang | H01L 33/60 257/E33.072 |
| 2010/0065950 | A1 | 3/2010 | Lowry et al. | |
| 2010/0133670 | A1* | 6/2010 | Liu | H01L 23/49524 438/122 |
| 2012/0069524 | A1* | 3/2012 | Schulz-Harder | H01L 23/473 361/716 |
| 2012/0080527 | A1* | 4/2012 | Finn | H01P 11/001 235/492 |
| 2012/0129299 | A1* | 5/2012 | Lin | H01L 23/5389 438/118 |
| 2013/0032203 | A1* | 2/2013 | Tam | H01L 31/048 438/66 |
| 2013/0207532 | A1* | 8/2013 | Tanuma | H05B 33/02 313/35 |
| 2013/0213697 | A1* | 8/2013 | Palaniswamy | H01L 33/486 174/254 |
| 2013/0299589 | A1* | 11/2013 | Finn | H01Q 1/2225 235/492 |
| 2013/0328204 | A1 | 12/2013 | Zommer | |
| 2015/0102479 | A1* | 4/2015 | Fuergut | H01L 21/3105 257/706 |
| 2015/0243591 | A1* | 8/2015 | von Koblinski | H01L 24/29 257/666 |
| 2015/0357269 | A1* | 12/2015 | Im | H01L 25/0657 257/676 |
| 2017/0062317 | A1 | 3/2017 | Son et al. | |
| 2017/0284880 | A1* | 10/2017 | Beer | H01L 23/49811 |
| 2019/0013261 | A1* | 1/2019 | Shiizaki | H01L 23/49582 |
| 2019/0221496 | A1* | 7/2019 | Tsuchimochi | H01L 23/562 |
| 2019/0279961 | A1* | 9/2019 | Iwasaki | H01L 23/49844 |

FOREIGN PATENT DOCUMENTS

| | | |
|---|---|---|
| CN | 103378018 A | 10/2013 |
| CN | 107919349 A | 4/2018 |
| DE | 11 2009 000 447 T5 | 3/2011 |
| DE | 10 2018 104 509 A1 | 10/2018 |
| EP | 0 115 000 B1 | 8/1989 |
| EP | 2 515 332 A2 | 6/2020 |
| JP | 2006-310887 A | 11/2006 |
| JP | 2009-044113 A | 2/2009 |
| JP | 2018-074059 A | 5/2018 |
| KR | 10-0296664 B1 | 10/2001 |
| KR | 10-1847168 B1 | 4/2018 |

OTHER PUBLICATIONS

Korean Office Action dated Apr. 10, 2020 from the corresponding Korean Application No. 10-2018-0155073, 6 pp.
Notice of Allowance issued in corresponding U.S. Appl. No. 16/697,601 dated Nov. 2, 2021.
Office Action issued in corresponding U.S. Appl. No. 16/697,601 dated Apr. 26, 2021.
Office Action issued in corresponding Chinese Patent Application No. 201911222003.9 dated Jan. 20, 2023.

* cited by examiner

DUAL SIDE COOLING POWER MODULE AND MANUFACTURING METHOD OF THE SAME

CROSS-REFERENCE TO RELATED APPLICATION

This application is the divisional application of U.S. patent application Ser. No. 16/697,601 filed on Nov. 27, 2019, which claims priority to and the benefit of Korean Patent Application No. 10-2018-0155073 filed on Dec. 5, 2018, the entire contents of which are incorporated herein by reference.

FIELD

The present disclosure relates to a dual side cooling power module and a manufacturing method of the same, and more particularly, to a dual side cooling power module for an eco-friendly vehicle (a hybrid electric vehicle (HEV), an electric vehicle (EV), a plug in hybrid vehicle (PHEV), etc.).

BACKGROUND

The statements in this section merely provide background information related to the present disclosure and may not constitute prior art.

A dual side cooling power module applied to an inverter for an eco-friendly vehicle (HEY, EV, PHEV, etc.) can meet electrical specifications when it employs a configuration in which a plurality of SiC elements form a multi-chip. The plurality of SiC elements are mounted using a wire bonding method. In this case, each element chip has a length of a wire different from each other, which causes a problem with parasitic inductance.

Chip performance is maintained at a junction temperature (Tj) of a SiC element of 200° C. or higher, of which requires module technology to take advantage. Conventionally, SiC elements are bonded by a soldering method. However, we have discovered that in the case of the soldering method, since solder has a melting point ranging from 180° C. to 220° C., premature deterioration occurs when it is used at a high temperature.

In addition, we have also found that since a dual side cooling power module is manufactured by soldering, warpage occurs due to a difference in coefficient of thermal expansion (CTE) between materials therein, thereby resulting in a high failure rate of the module. Furthermore, since a module to which SiC elements are applied has small chip sizes, there is a problem that it has an area for transmitting heat to an upper substrate of a chip smaller than that of an insulated gate bipolar transistor (IGBT) having larger chip sizes, thereby increasing thermal resistance.

SUMMARY

The present disclosure provides a dual side cooling power module in which an internal structure of the module can be simplified for efficient dual side cooling, and a manufacturing method thereof.

According to one aspect of the present disclosure, a dual side cooling power module is provided. The dual side cooling power module may include: a lower substrate having a recessed portion on at least one surface thereof, a semiconductor chip formed in the recessed portion, lead frames formed at both ends of the lower substrate, and an upper substrate formed on the semiconductor chip, a portion of the lead frames, and the lower substrate.

In the dual side cooling power module, a portion of an upper surface of the lower substrate is stepped to form the recessed portion such that the semiconductor chip does not protrude to the upper surface of the lower substrate.

In the dual side cooling power module, an internal space between the recessed portion and the semiconductor chip may be filled with an underfill.

In the dual side cooling power module, both ends of the lower substrate may be processed to be stepped such that the lead frames do not protrude to the upper surface of the lower substrate.

In the dual side cooling power module, the semiconductor chip may be bonded to the upper surface of the lower substrate and a lower surface of the upper substrate by using a conductive adhesive.

In the dual side cooling power module, the semiconductor chip may include a SiC MOSFET element.

In the dual side cooling power module, both ends of the lower surface of the upper substrate may be processed to be stepped.

In the dual side cooling power module, both ends of the lower substrate and both ends of the upper substrate may be bonded to each other by applying a nonconductive adhesive thereto.

In the dual side cooling power module, a molding portion formed to surround outer peripheral surfaces of the lower substrate, the lead frames, and the upper substrate may be provided, and at least a portion of the lead frames may protrude outside the molding portion.

According to another aspect of the present disclosure, a manufacturing method of a dual side cooling power module is provided. The manufacturing method of the dual side cooling power module may include: forming a recessed portion on at least one surface of a lower substrate; forming a semiconductor chip in the recessed portion; forming lead frames at both ends of the lower substrate; and forming an upper substrate on the semiconductor chip, a portion of the lead frames, and the lower substrate.

In the manufacturing method of the dual side cooling power module, the recessed portion may be processed to be stepped so that the semiconductor chip does not protrude to an upper surface of the lower substrate, and the process of forming the semiconductor chip may include: applying a conductive adhesive to a lower surface of the semiconductor chip and then bonding the semiconductor chip in the recessed portion; and filling an internal space between the recessed portion and the semiconductor chip with an underfill.

In the manufacturing method of the dual side cooling power module, the process of forming the lead frames may include: processing both ends of the lower substrate to be stepped such that the lead frames do not protrude to the upper surface of the lower substrate before the lead frames are bonded to both ends of the lower substrate; and bonding the lead frames to both ends of the stepped lower substrate using a sintering method or an ultrasonic welding method.

In the manufacturing method of the dual side cooling power module, the process of forming the upper substrate may include: applying a conductive adhesive to the upper surface of the semiconductor chip; applying a nonconductive adhesive to the lower substrate and the lead frames except the upper surface of the semiconductor chip; applying a nonconductive adhesive to both ends of a lower surface of the upper substrate; and disposing the lower substrate and the upper substrate to which the nonconductive adhesive is applied to face each other and then bonding the lower substrate and the lower substrate.

In the manufacturing method of the dual side cooling power module, a process of processing both ends of the lower surface of the upper substrate to be stepped may be provided before the process of applying the nonconductive adhesive to both ends of the lower surface of the upper substrate.

In the manufacturing method of the dual side cooling power module, a process of forming a molding portion to surround outer peripheral surfaces of the lower substrate, the lead frames, and the upper substrate may be provided after the process of forming the upper substrate, and at least a portion of the lead frames may protrude outside the molding portion.

According to the exemplary forms of the present disclosure as described above, a large reduction effect can be achieved with respect to fast switching of a SiC MOSFET of the multi-chip due to matching of current paths and reduction of resistive components, the chip temperature can be used above 200° C., thereby reducing a cooling system of a hybrid electric vehicle, thermal deformation due to a difference in module thickness and thermal expansion coefficient of materials can be reduced or minimized by pressing, heating and bonding with two flat presses, and thermal resistance can be lowered than that of a conventional IGBT module so that heat inside the chip can be released more quickly, thereby reducing a load on the cooling system.

In addition, it is possible to realize a dual side cooling power module which has a heat dissipation route other than a spacer due to a sintering junction having excellent thermal conductivity, thereby enabling efficient heat dissipation, and a manufacturing method thereof. It should also be understood that the scope of the present disclosure is not limited by the above effects.

Further areas of applicability will become apparent from the description provided herein. It should be understood that the description and specific examples are intended for purposes of illustration only and are not intended to limit the scope of the present disclosure.

DRAWINGS

Figure 13:
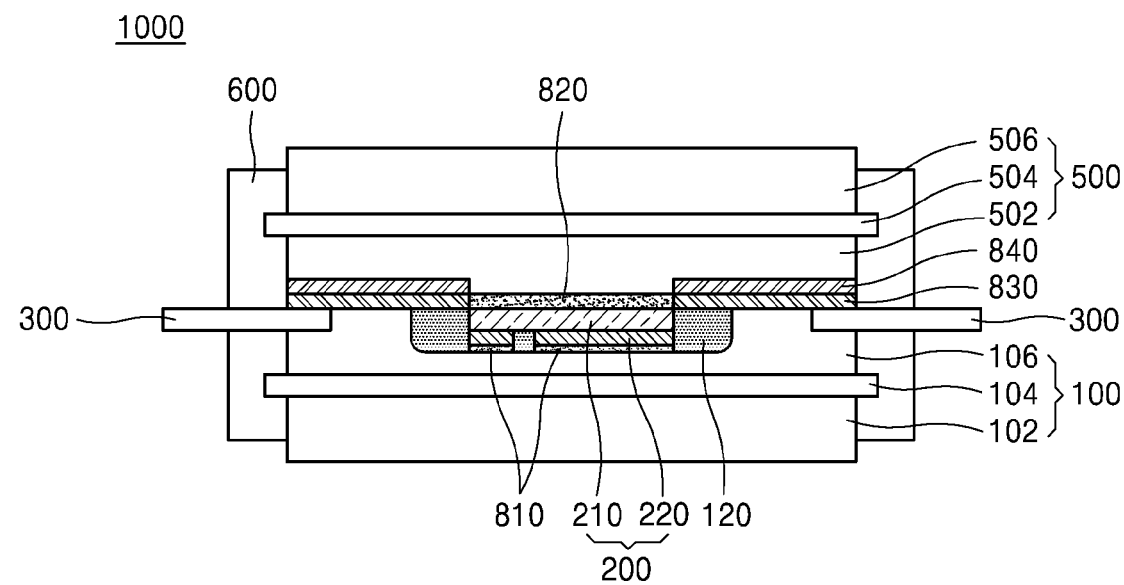
Figure 14:
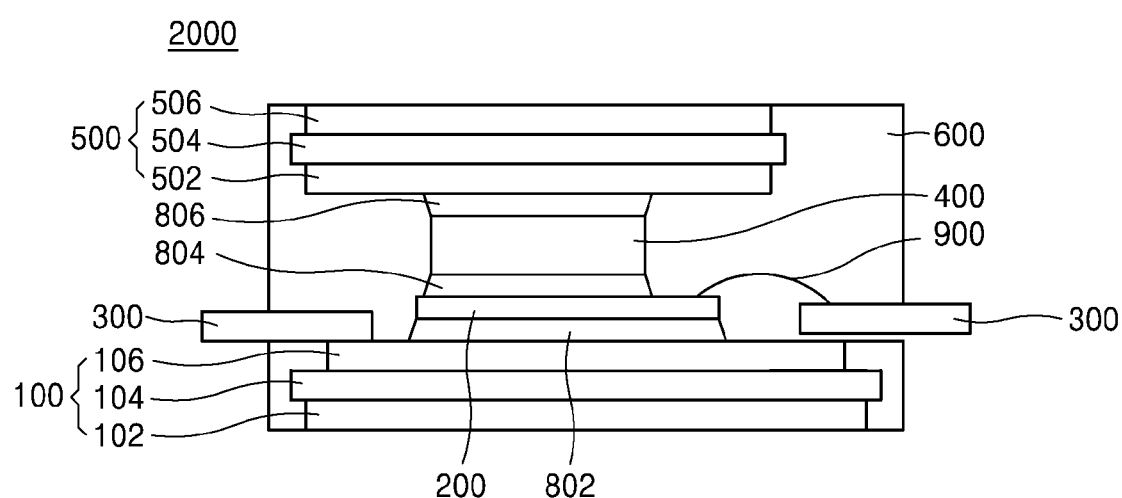

In order that the disclosure may be well understood, there will now be described various forms thereof, given by way of example, reference being made to the accompanying drawings, in which:

FIGS. 1 to 13 are cross-sectional views schematically illustrating a manufacturing method of a dual side cooling power module according to one embodiment of the present invention in the order of a process sequence thereof; and FIG. 14 is a cross-sectional view schematically illustrating a dual side cooling power module.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

However, it should be understood that the present disclosure is not limited to the forms described below and may be implemented in various different forms, and the following forms are provided to fully convey the scope of the present disclosure to those skilled in the art. In addition, for convenience of description, sizes of the components in the figures may be exaggerated or reduced.

First, FIG. 14 is a cross-sectional view schematically illustrating a dual side cooling power module according to a comparative example of the present disclosure. The dual side cooling power module 2000 may include a lower substrate 100, a semiconductor chip 200, lead frames 300, a spacer 400, an upper substrate 500, and a molding portion 600.

For example, an active metal brazed copper (AMC) substrate or a direct bonded copper (DBC) substrate is used for the lower substrate 100 and the upper substrate 500. The semiconductor chip 200 for driving a motor of a hybrid vehicle is first bonded by soldering to the lower substrate 100 using a first solder preform 802. Here, the semiconductor chip 200 has an upper surface as an emitter and a lower surface as a collector, and is operated such that current flows from the collector to the emitter. A diode also works in a similar way.

Thereafter, the lead frames 300 are formed on the lower substrate 100, and the semiconductor chip 200 and any one of the lead frames 300 are connected by wire-bonding to each other. Subsequently, the spacer 400 is bonded by soldering on the semiconductor chip 200 using a second solder preform 804, and the upper substrate 500 is bonded by soldering on the spacer 400 using a third solder preform 806, which is then encapsulated by the molding portion 600 so as to form an overall structure.

On the other hand, for example, a metal having excellent conductivity such as copper (Cu) may be used for the spacer 400, and the spacer 400 has a function of maintaining a gap between the lower substrate 100 and the upper substrate 500 in order to protect a wire 900 electrically connecting the semiconductor chip 200 and a first external lead 310.

The aforementioned structure causes the following problems. A plurality of semiconductor chips 200 use, for example, SiC elements and are mounted using a wire bonding method. In this case, each semiconductor chip 200 has a length of a wire different from each other, which causes a problem with parasitic inductance. In addition, chip performance is maintained at a junction temperature (Tj) of a SiC element, approximately 200° C. or higher, of which requires module technology to take advantage. Conventionally, the semiconductor chip 200 is bonded by soldering. However, in the case of the soldering method, since solder has a melting point ranging from 180° C. to 220° C., premature deterioration occurs when it is used at a high temperature.

In addition, since the dual side cooling power module 2000 is manufactured by soldering, warpage occurs due to a difference in coefficient of thermal expansion (CTE) between materials therein, thereby resulting in a high failure rate of the module. Since a module to which SiC elements are applied has small chip sizes, there is a problem that it has an area for transmitting heat to an upper substrate of a chip smaller than that of an insulated gate bipolar transistor (IGBT) having larger chip sizes, thereby increasing thermal resistance.

In order to solve the problems, the present disclosure provides a dual side cooling power module in which an internal structure of the module is simplified, performance of the module is improved due to a robust structure, a structure in which cooling is possible on both sides of the module is provided, a heat dissipating surface is designed to be insulated, and a bonding contact is provided so that a power terminal and a signal terminal of a chip can be bonded to an external control board of the module, thereby providing excellent cooling efficiency, and a manufacturing method thereof.

FIGS. 1 to 13 are cross-sectional views schematically illustrating a manufacturing method of a dual side cooling power module according to one form of the present disclosure in the order of a process sequence thereof.

First, referring to FIG. 13, the dual side cooling power module 1000 according to one form of the present disclosure may include a lower substrate 100 having a recessed portion 110 on at least one surface thereof, a semiconductor chip 200 formed in the recessed portion 110, lead frames 300 formed at both ends of the lower substrate 100, and an upper substrate 500 formed on the semiconductor chip 200, at least a portion of the lead frames 300, and the lower substrate 100.

Here, the recessed portion 110 may be formed by processing at least a portion of the upper surface of the lower substrate 100 to be stepped such that the semiconductor chip 200 does not protrude to the upper surface of the lower substrate 100. Cu wirings may be formed on upper surfaces of the recessed portion 110 and the lower substrate 100. In this step, the semiconductor chip 200 may be formed not to protrude to the upper surface of the lower substrate 100. In one form, bonded portions of the semiconductor chip 200 are formed not to protrude over the lower substrate 100. In this case, an upper surface of the semiconductor chip 200 may be formed higher than the upper surface of the lower substrate 100 in accordance with heights of Cu bumps.

On the other hand, the semiconductor chip 200 may include, for example, SiC MOSFET elements. In the semiconductor chip 200, Cu bumps 220 may be formed on gates and source electrode pads 210, and first conductive adhesives 810 may be laminated and bonded thereon. For example, an Ag film or paste may be used for the first conductive adhesive 810.

At this time, an internal space between the recessed portion 110 and the semiconductor chip 200 is filled with an underfill 120. For example, a resin such as epoxy or the like may be used for a material of the underfill 120.

In addition, both ends of the lower substrate 100 may be processed to be stepped such that the lead frames 300 do not protrude to the upper surface of the lower substrate 100. The lead frames 300 are formed at both stepped ends to function as a power terminal and a signal terminal. After the lead frames 300 are formed, a nonconductive adhesive may be applied to a region requiring insulation (at both ends of the lower substrate 100), a nonconductive adhesive may be applied to both ends of a lower surface of the upper substrate 500 corresponding to the region, and then they may bonded to face each other. In another form, both ends of the lower surface of the upper substrate 500 may be bonded in a stepped form to increase bonding with the semiconductor chip 200, and a conductive adhesive is applied to the upper surface of the semiconductor chip 200 to bond the lower substrate 100 and the upper substrate 500 to each other. In this case, the upper surface of the semiconductor chip 200 is directly bonded to the lower surface of the upper substrate 500 using a second conductive adhesive 820 so that a conventionally used spacer may be omitted.

In other form, a molding portion 600 surrounding outer peripheral surfaces of the lower substrate 100, the lead frames 300, and the upper substrate 500 is provided, and at least a portion of the lead frames 300 may protrude outside the molding portion 600.

Hereinafter, a manufacturing method of the dual side cooling power module 1000 according to one form of the present disclosure will be described in detail with reference to FIGS. 1 to 13.

Figure 2:
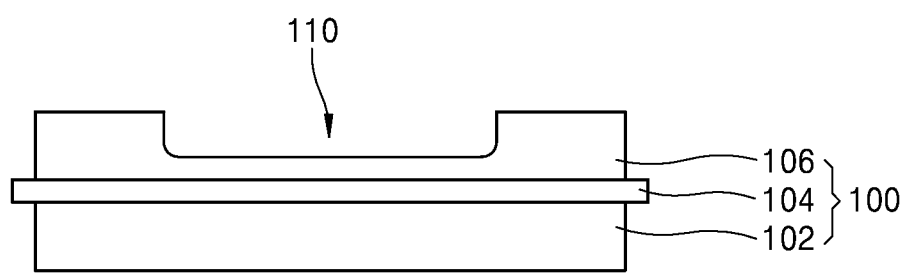

Referring to FIGS. 1 and 2, in the manufacturing method of the dual side cooling power module 1000 according to one form of the present disclosure, the recessed portion 110 may be formed on at least one surface of the lower substrate 100. Here, the lower substrate 100 includes a direct bonded copper (DBC) substrate, and the DBC substrate includes a ceramic layer 104 between a first metal layer 102 and a second metal layer 106.

The recessed portion 110 is formed on at least one surface of the prepared lower substrate 100, for example, the upper surface of the lower substrate 100. The recessed portion 110 has been processed to be stepped so that the semiconductor chip (200 shown in FIG. 3) which will be bonded later does not protrude to the upper surface of the lower substrate 100. However, in accordance with a thickness of the lower substrate 100 or a thickness of the second metal layer 106, the recessed portion 110 may be processed to be stepped to have a height at which bonded portions of the semiconductor chip 200 shown in FIG. 3 do not protrude thereto.

Figure 3:
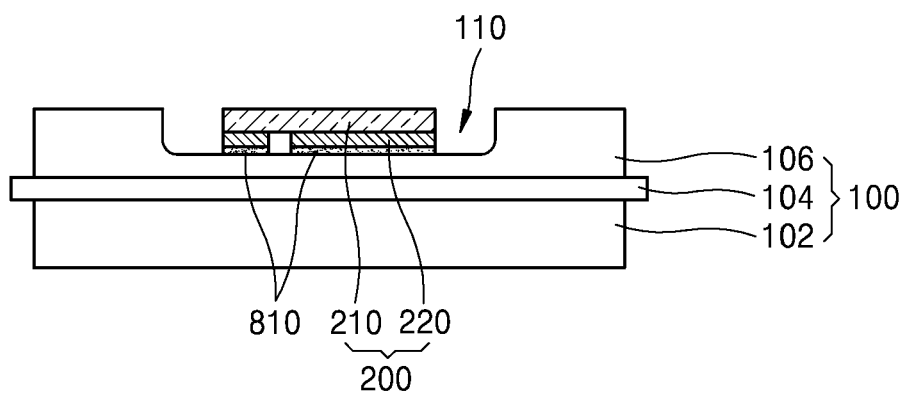
Figure 4:
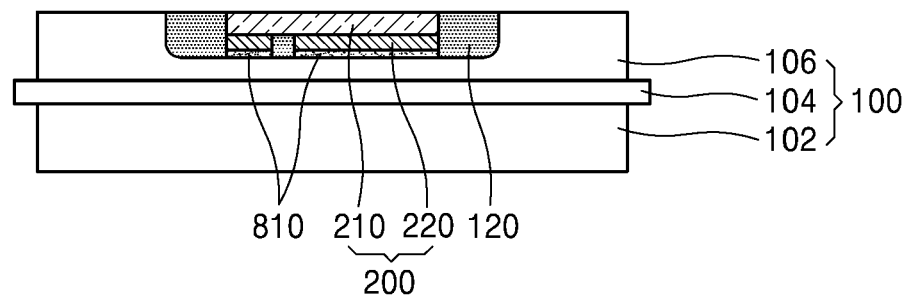

Thereafter, as shown in FIG. 3, the semiconductor chip 200 may be formed in the recessed portion 110. The semiconductor chip 200 has a structure in which the bumps 220 are formed on the pads 210 and are bonded by flip chip bonding to the recessed portion 110. In this case, bonding surfaces of the bumps 220 are bonded using a conductive paste or a film. After the bonding is completed, the underfill 120 is filled in the internal space between the recessed portion 110 and the semiconductor chip 200 as shown in FIG. 4.

Figure 5:
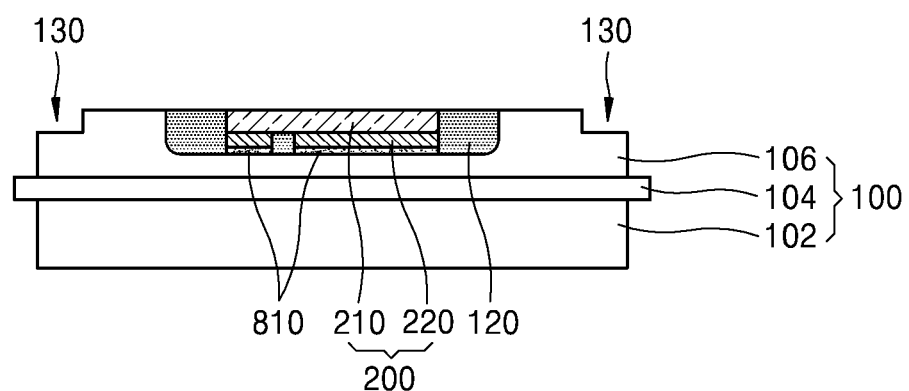
Figure 6:
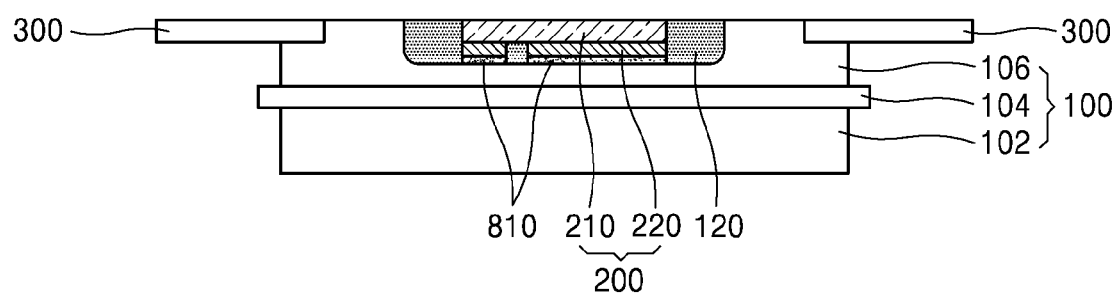

As shown in FIG. 5, first steps 130 are formed at positions where the lead frames 300 shown in FIG. 6 will be formed. The first steps 130 may be processed to be stepped on both ends of the lower substrate 100 such that the lead frames 300 shown in FIG. 6 do not protrude to the upper surface of the lower substrate 100. Thereafter, as shown in FIG. 6, the lead frames 300 may be bonded to the first steps 130 using a sintering method or an ultrasonic welding method.

Figure 7:
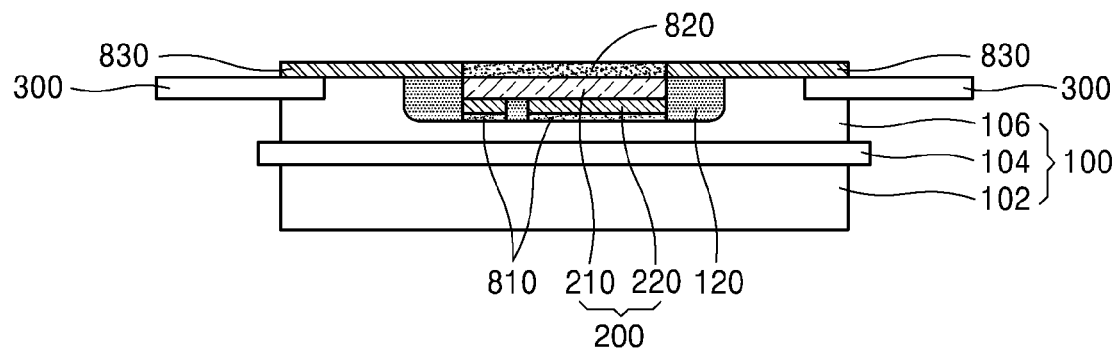

Referring to FIG. 7, after the lead frames 300 are bonded, the second conductive adhesive 820 may be applied to the upper surface of the semiconductor chip 200, and a first nonconductive adhesive 830 may be applied to insulate the upper surface of the lower substrate 100 to which the second conductive adhesive 820 is not applied and at least a portion of the lead frames 300.

Figure 8:
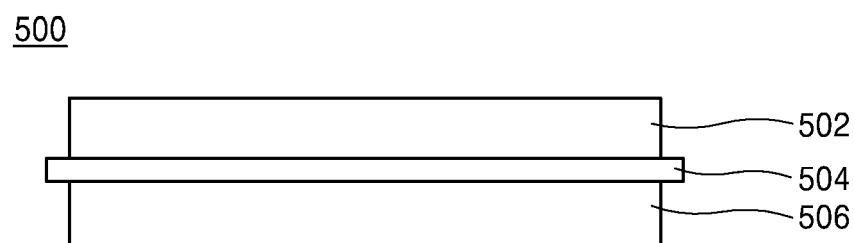
Figure 9:
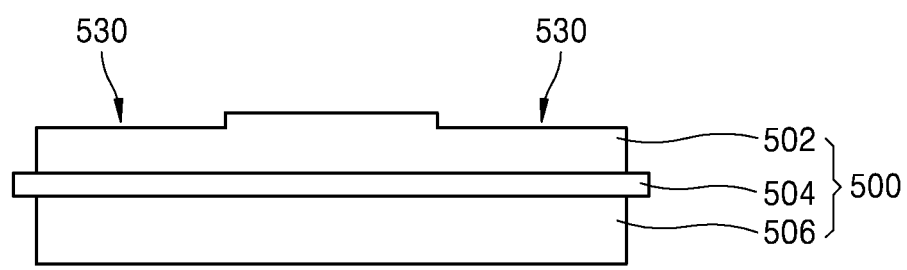
Figure 10:
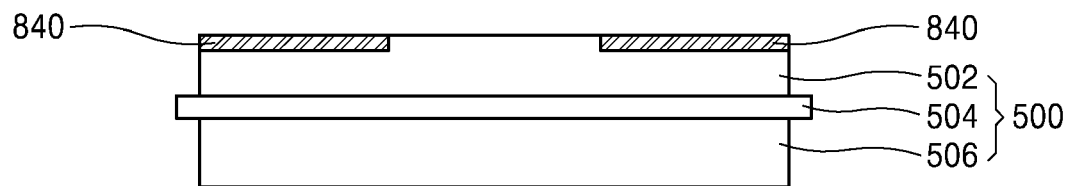

On the other hand, referring to FIGS. 8 to 10, the upper substrate 500 may use the same type of substrate as that of the lower substrate 100 and may be provided with a ceramic layer 504 between a first metal layer 502 and a second metal layer 506. A second nonconductive adhesive 840 may be applied to the lower surface of the prepared upper substrate 500, that is, both ends of the first metal layer 502 so that it can correspond to the first nonconductive adhesive 830 applied to both ends of the lower substrate 100 in the same region. Here, the first nonconductive adhesive 830 and the second nonconductive adhesive 840 may be the same.

In another form, before applying the second nonconductive adhesive 840 to both ends of the lower surface of the upper substrate 500, second steps 530 may be formed on both ends of the first metal layer 502 of the upper substrate 500. The second steps 530 are not necessarily formed, but it can be understood that partial processing for forming the steps is performed to enhance bonding characteristics of portions bonded to the semiconductor chip 200.

Figure 11:
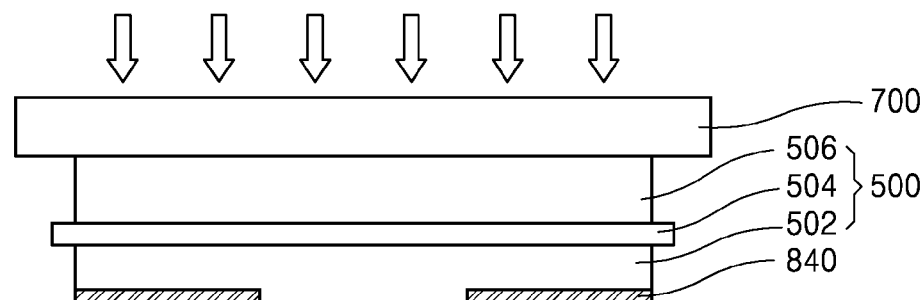
Figure 11:
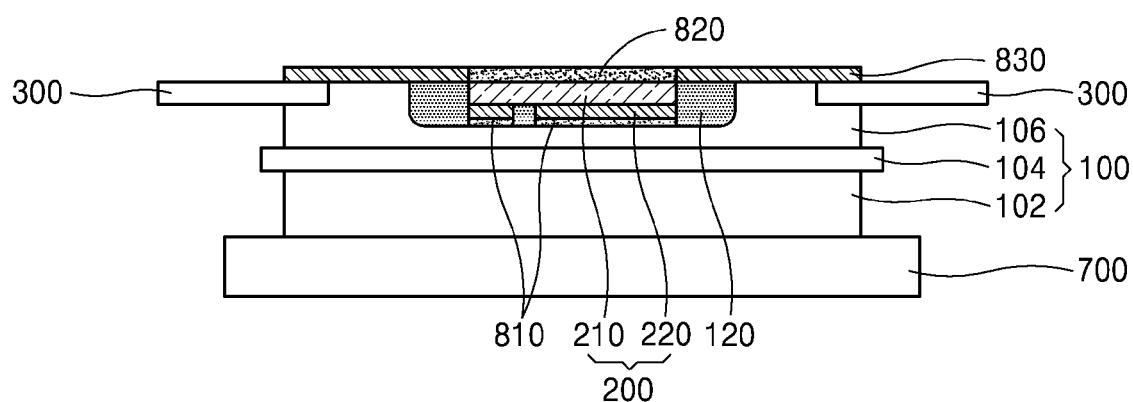
Figure 12:
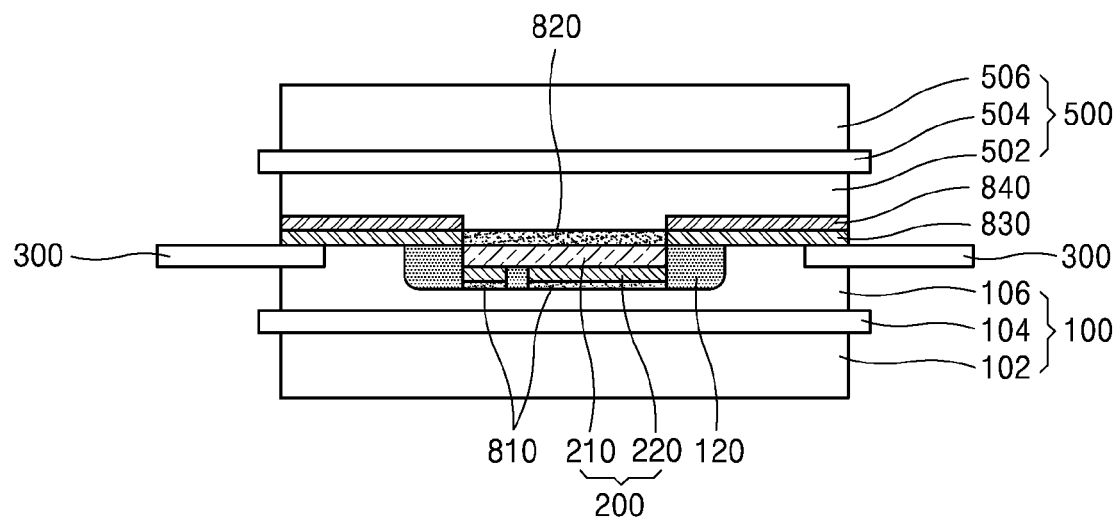

Next, referring to FIGS. 11 and 12, the lower substrate 100 to which the first nonconductive adhesive 830 is applied and the upper substrate 500 to which the second nonconductive adhesive 840 is applied may be disposed to face each other, and then the lower substrate 100 and the upper substrate 500 may be bonded to each other. In this case, heater blocks 700 are disposed on a lower surface of the first metal layer 102 of the lower substrate 100 and an upper surface of the second metal layer 506 of the upper substrate 500, and then thermally compressed by applying a force in the arrow direction, the upper substrate 500 may be thermally compressed and bonded to the semiconductor chip 200, at least a portion of the lead frames 300, and the lower substrate 100.

Here, the semiconductor chip 200 is bonded by sintering via the second conductive adhesive 820, and curing reaction of adhesive occurs in the insulated region where the first nonconductive adhesive 830 and the second nonconductive adhesive 840 are applied, whereby the upper surface of the semiconductor chip 200 is directly bonded to the lower surface of the upper substrate 500 via the second conductive adhesive 820, so that a conventionally used spacer may be omitted.

As shown in FIG. 13, after the upper substrate 500 is bonded, the molding portion 600 is formed to surround the outer peripheral surfaces of the lower substrate 100, the lead frames 300, and the upper substrate 500 so that at least a portion of the lead frames 300 protrudes outside the molding portion 600, whereby the dual side cooling power module 1000 having a simplified internal structure to be applicable to an inverter for an eco-friendly vehicle may be manufactured.

Here, for example, a polymer material having excellent insulation and protection properties such as epoxy molding compound (EMC) or polyimide-based material may be used for the molding portion 600. The molding portion 600 may encapsulate all regions except for regions where the lead frames 300 are exposed, the lower surface of the lower substrate 100 and the upper surface of the upper substrate 500. Since the above structure does not use a spacer, regions between edges of the module and power terminals and signal terminals may be easily insulated and fixed without filling gaps formed between the lower substrate 100 and the upper substrate 500 with the molding portion 600.

Although not shown in the figures, finally, after the molding portion 600 is formed, at least a portion of the lead frames 300 may be trimmed. After unnecessary portions of the lead frames 300 are trimmed, the module may have a form in which only the signal terminals and the power terminals protrude outside the molding portion 600.

As described above, in the dual side cooling power module according to the form of the present disclosure, the spacer may be omitted by flip-chip bonding SiC elements using Ag bumps and Cu patterns instead of Al wire bonding, and the molding portion between the lower DBC substrate and the upper DBC substrate can be reduced or eliminated, thereby providing excellent heat dissipation characteristics.

In addition, a resistive-capacitive (RC) delay due to wire bonding can be reduced, chip performance is maintained even at a high temperature of 200° C. or higher, and warpage of the substrates during the molding process can be controlled. Since the inside of the module is entirely filled with materials, even if thermal pressure is applied to the module from above and below, temperature and pressure distributions evenly influence the entire area without concentrating on the chip, and thus the molding process can be performed smoothly.

Further, conventionally, the module is bonded by soldering with a spacer metal disposed therein. Accordingly, solder layers having large thermal resistances are applied thereto, which results in a limit to reducing a thickness thereof. However, according to the present disclosure, since the Cu layers can be formed relatively thicker than those in the IGBT module while reducing the thickness, efficient cooling is possible by increasing a diffusion rate of heat in a lateral direction of the chip.

While the present disclosure has been described with reference to the forms shown in the figures, it should be understood that these are merely exemplary and those skilled in the art can make various modifications and other forms equivalent thereto on the basis of the above.

EXPLANATION OF REFERENCES

100 Lower substrate
110 Recessed portion
120 Underfill
130 First step
102, 502 First metal layer
104, 504 Ceramic layer
106, 506 Second metal layer
200 Semiconductor chip
210 Pad
220 Cu bump
300 Lead frame
400 Spacer
500 Upper substrate
530 Second step
600 Molding portion
700 Heater block
802 First Solder Preform
804 Second Solder Preform
806 Third solder preform
810 First Conductive Adhesive
820 Second conductive adhesive
830 First nonconductive adhesive
840 Second nonconductive adhesive
900 Wire
1000, 2000 Dual side Cooling Power Module

What is claimed is:
1. A manufacturing method of a cooling power module to cool dual sides of a semiconductor chip, the method comprising:
forming a recessed portion on one surface of a lower substrate;
disposing the semiconductor chip in the recessed portion;
forming lead frames at both ends of the lower substrate;
applying a first conductive adhesive to an upper surface of the semiconductor chip;
applying a first nonconductive adhesive to the one surface of the lower substrate and a portion of the lead frames; and
bonding an upper substrate to the semiconductor chip through the first conductive adhesive, and to the portion of the lead frames and the lower substrate through the first nonconductive adhesive;
wherein the upper substrate and the lower substrate are provided in a form of multi-chips, and cooling is performed to cool dual sides of the semiconductor chip.
2. The method according to claim 1, wherein:
the recessed portion is processed to be stepped such that the semiconductor chip does not protrude to the one surface of the lower substrate, and disposing the semiconductor chip includes:

applying a second conductive adhesive to a lower surface of the semiconductor chip and then bonding the semiconductor chip in the recessed portion; and filling an internal space between the recessed portion and the semiconductor chip with an underfill.

3. The method according to claim 1, wherein forming the lead frames includes:

processing the both ends of the lower substrate to be stepped such that the lead frames do not protrude to the one surface of the lower substrate before the lead frames are bonded to the both ends of the lower substrate; and bonding the lead frames to the both ends of the stepped lower substrate using a sintering method or an ultrasonic welding method.

4. The method according to claim 1, further comprising:

applying a second nonconductive adhesive to both ends of a lower surface of the upper substrate, wherein the upper substrate and the lower substrate are bonded through the first and second nonconductive adhesives.

5. The method according to claim 4, further comprising:

processing both ends of the lower surface of the upper substrate to be stepped before applying the second nonconductive adhesive to the both ends of the lower surface of the upper substrate.

6. The method according to claim 1, further comprising:

forming a molding portion to surround outer peripheral surfaces of the lower substrate, the lead frames, and the upper substrate after bonding the upper substrate, wherein a portion of the lead frames protrudes outside the molding portion.

7. The method according to claim 2, wherein the first nonconductive adhesive is also applied to the underfill.

* * * * *